United States Patent
Ishikawa

(10) Patent No.: US 10,401,730 B2
(45) Date of Patent: Sep. 3, 2019

(54) METHOD FOR PRODUCING MICROSTRUCTURE AND METHOD FOR PRODUCING LIQUID EJECTION HEAD

(71) Applicant: CANON KABUSHIKI KAISHA, Tokyo (JP)

(72) Inventor: Tetsushi Ishikawa, Tokyo (JP)

(73) Assignee: Canon Kabushiki Kaisha, Tokyo (JP)

(*) Notice: Subject to any disclaimer, the term of this patent is extended or adjusted under 35 U.S.C. 154(b) by 221 days.

(21) Appl. No.: 15/226,700

(22) Filed: Aug. 2, 2016

(65) Prior Publication Data

US 2017/0038689 A1    Feb. 9, 2017

(30) Foreign Application Priority Data

Aug. 4, 2015  (JP) ................. 2015-154286

(51) Int. Cl.
| | |
|---|---|
| G03F 7/20 | (2006.01) |
| G03F 7/38 | (2006.01) |
| G03F 7/32 | (2006.01) |
| G03F 7/40 | (2006.01) |
| B41J 2/16 | (2006.01) |

(52) U.S. Cl.
CPC .......... *G03F 7/2024* (2013.01); *B41J 2/1601* (2013.01); *B41J 2/1603* (2013.01); *B41J 2/1631* (2013.01); *G03F 7/20* (2013.01); *G03F 7/32* (2013.01); *G03F 7/38* (2013.01); *G03F 7/40* (2013.01)

(58) Field of Classification Search
CPC .. G03F 7/2024; G03F 7/38; G03F 7/40; B41J 2/1631
USPC .................................................. 430/394, 330
See application file for complete search history.

(56) References Cited

U.S. PATENT DOCUMENTS

2008/0260961 A1* 10/2008 Kobayashi ............ B41J 2/1433
                                                                427/487

FOREIGN PATENT DOCUMENTS

| JP | 2008-526553 A | 7/2008 |
|---|---|---|
| JP | 2008-238576 A | 10/2008 |
| JP | 2010-276694 A | 12/2010 |
| JP | 2013-157419 A | 8/2013 |

* cited by examiner

*Primary Examiner* — Daborah Chacko-Davis
(74) *Attorney, Agent, or Firm* — Canon U.S.A., Inc. IP Division

(57) ABSTRACT

A method for producing a microstructure provided with a member in which, on a substrate having a plurality of concave shapes processed thereon, a dry film resist is subjected to tenting on open faces of a plurality of concave shapes, and then openings are formed in the dry film resist where divided exposure is performed such that patterning is performed with first exposure light and second exposure is performed to cause overexposure.

14 Claims, 4 Drawing Sheets

METHOD FOR PRODUCING MICROSTRUCTURE AND METHOD FOR PRODUCING LIQUID EJECTION HEAD

BACKGROUND OF THE INVENTION

Field of the Invention

The present invention relates to a method for producing a microstructure and, in particular, relates to a method for producing a liquid ejection head.

Description of the Related Art

A recording device (liquid ejection apparatus) using an ink jet system is configured to eject ink (recording liquid) droplets through ejection orifices of a liquid ejection head to attach the ink droplets to a record medium for recording.

The liquid ejection head includes a substrate on a surface of which electric wiring, energy generating elements to generate energy for ejecting ink, and the like are formed, and a plurality of nozzles are provided on the substrate. Each of the ejection orifices includes a bubble generating chamber for generating bubbles using the energy generating element, a minute ejection orifice for ejecting ink droplets, a flow passage for supplying ink, and the like. Further, the substrate is provided with an ink supply path penetrating the substrate from a front surface to a rear surface for supplying ink from the outside. As for the ink supply path, there are known a configuration in which ink is directly supplied from a liquid chamber (referred to as a common liquid chamber) shared by a plurality of bubble generating chambers, and a configuration in which ink is supplied from the common liquid chamber to the bubble generating chambers via independent supply ports.

In the liquid ejection head having the configuration described above, the bubble generating chambers are filled with ink supplied from the rear surface side of the substrate through the ink supply path. The ink filling the bubble generating chambers is ejected from the ejection orifices as ink droplets due to a discharge energy by the energy generating element, for example, bubbles generated through film boiling.

A liquid ejection head described in PCT Japanese Translation Patent Publication No. 2008-526553 is provided with ejection orifices at high density, and a polymer film in which a flow passage manifold is made by laser processing is bonded between ink feed conduits and the liquid ejection head with a support member for pitch conversion and a bonding layer in between. Then, ink is supplied to the ink feed conduits via the flow passage manifold as a flow passage member formed of the polymer film.

SUMMARY OF THE INVENTION

The present invention provides a method for producing a microstructure provided with a member in which, on a substrate having a plurality of concave shapes processed thereon, a negative dry film resist is subjected to tenting on open faces of the plurality of concave shapes, and then openings are formed in a tenting part of the dry film resist. The method includes forming the openings through steps including a first exposure step of performing exposure with first exposure light for the dry film resist other than a region in which the openings are formed, a post baking step, and a step of developing an unexposed part at the first exposure step with developer; and forming the member by performing steps including a second exposure step of performing exposure so as to cause overexposure with second exposure light and a step of performing curing processing, in this order, in which an exposure dose (E1) of the first exposure light is six times or less of an exposure dose ($E_{gel}$) for gelling of the dry film resist.

Further features of the present invention will become apparent from the following description of exemplary embodiments with reference to the attached drawings.

BRIEF DESCRIPTION OF THE DRAWINGS

FIGS. 1A and 1B are schematic views illustrating an example of a liquid ejection head obtained by a producing method of the invention, in which FIG. 1A is a plan view and FIG. 1B is a perspective sectional view.

DESCRIPTION OF THE EMBODIMENTS

Figure 1A:
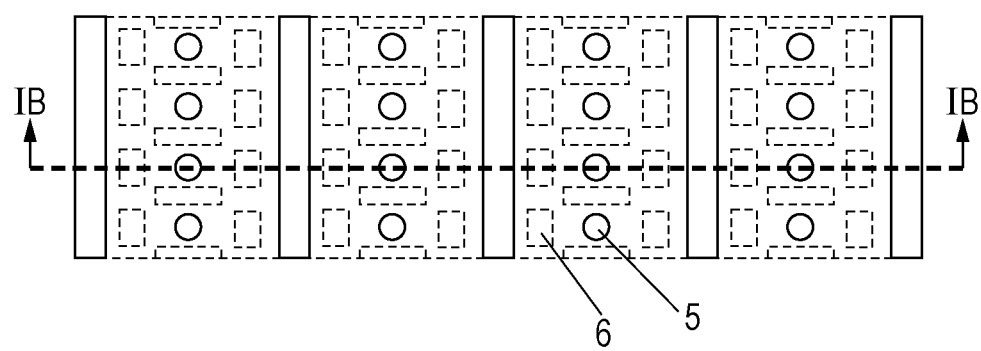

When a polymer film on which openings have been formed by laser processing is bonded to a support member (substrate) as in PCT Japanese Translation Patent Publication No. 2008-526553, there is a limit to how much the accuracy and density can be increased. Thus, in order to achieve further increase in accuracy and increase in density, a method has been known for tenting a photosensitive dry film resist on a common liquid chamber formed on a rear surface side of the substrate to form an opening such as a flow passage manifold by using a photolithography technique. When a flow passage member is formed by exposing the dry film with such a method, however, it is necessary for forming an excellent opening to suppress an effect of diffused reflection by a bottom surface of the common liquid chamber, and therefore an exposure dose is required to be suppressed to the minimum necessary. However, when the exposure dose is suppressed, there arises a problem that adhesiveness between the substrate and the flow passage member becomes insufficient.

The invention aims to provide a microstructure provided with a member having an opening, which is excellent in adhesiveness with a substrate, without deteriorating an opening shape.

Though embodiments of the invention will be described below, the invention is not limited to these embodiments.

According to the invention, in a substrate having a plurality of concave shapes processed thereon, a dry film resist is subjected to tenting on open faces of the plurality of concave shapes, and by using a photolithography technique, openings each having an excellent shape are formed on a tenting part and a member excellent in adhesiveness with the substrate is formed. With the invention, it is possible to produce a microstructure provided with the member. An example of the microstructure includes a liquid ejection head.

A liquid ejection head obtained by the invention is able to be mounted on, for example, an apparatus such as a printer, a copy machine, a facsimile machine, or a word processor having a printer unit, or an industrial recording apparatus combined with a processor of various kinds. The liquid ejection head can be also used in, for example, an apparatus for manufacturing a biochip, for printing of electronic circuits, or for spraying chemicals.

The substrate having the plurality of concave shapes processed thereon is not particularly limited, and an example thereof includes a substrate which is used for the liquid ejection head and on which a plurality of common liquid chambers each having a concave shape are processed. The dry film resist is subjected to tenting on the open faces of the substrate on which the plurality of common liquid chambers are processed, and with the use of a photolithography technique, a flow passage member having excellent opening shapes and excellent in adhesiveness with the substrate is able to be formed. An example of a method for producing a liquid ejection head which is an aspect of a microstructure will be described below with reference to drawings.

Figure 1B:
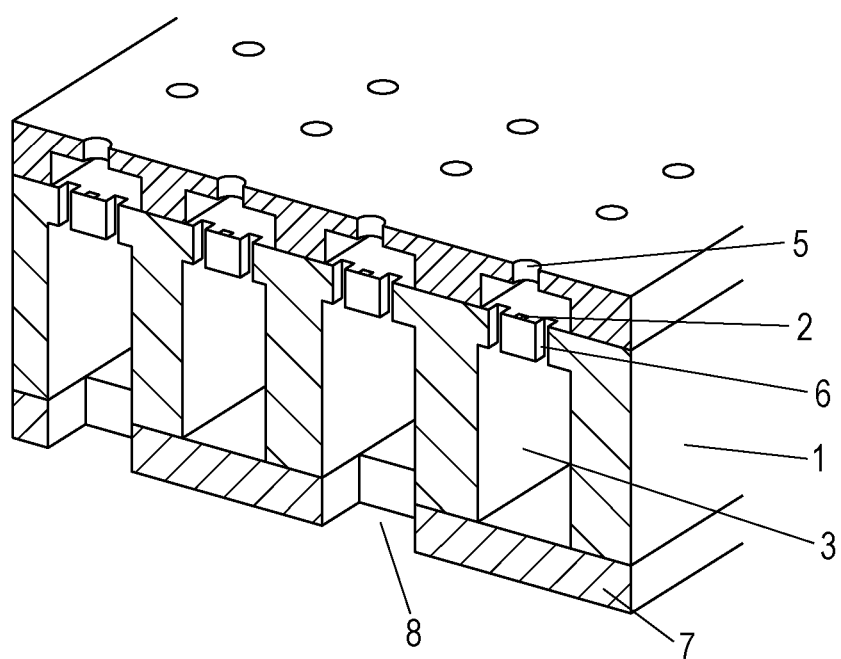

FIGS. 1A and 1B are schematic views illustrating an example of the liquid ejection head according to the invention. FIG. 1A is a plan view of the liquid ejection head as observed from an ejection surface and FIG. 1B is a perspective sectional view having a cross section taken along a broken line IB-IB of FIG. 1A. The liquid ejection head of the invention illustrated in FIGS. 1A and 1B includes a substrate 1 on which energy generating elements 2 to generate energy used for ejecting liquid such as ink are formed at a predetermined pitch. On the substrate 1, there are formed a flow passage member 7 in which a flow passage manifold 8 for guiding ink to each common liquid chamber 3 is provided, ejection orifices 5 which are open above the energy generating elements 2, and individual liquid ink supply ports 6 which communicate with the respective ejection orifices 5 from the common liquid chambers 3. At least one flow passage manifold 8 is required for each of the common liquid chambers 3, but a plurality of flow passage manifolds 8 may be provided for each of the common liquid chambers 3. Each of the flow passage manifolds 8 may be formed at the common liquid chamber 3 such that the flow passage manifolds 8 are not arranged in line with each other with respect to the adjacent common liquid chambers 3, for example, by forming the flow passage manifolds 8 in every other common liquid chambers 3 in a predetermined cross sectional direction as illustrated in FIG. 1B. In addition, each of the flow passage manifolds 8 may be formed not only with almost the same width as an opening width of each of the common liquid chambers 3 as illustrated in FIG. 1B but also with an opening width narrower than the opening width of each of the common liquid chambers 3. The producing method according to the invention relates to improvement in opening shapes of the flow passage manifolds 8 or the like, and in adhesiveness between the flow passage member 7 and the substrate 1.

FIGS. 2A to 2H are schematic sectional views taken along a broken line IB-IB of FIG. 1A, and illustrate an example of the method for producing the liquid ejection head of the invention in a stepwise manner. An example of the method for producing the liquid ejection head of the invention will be described below with reference to FIGS. 2A to 2H.

Figure 2A:
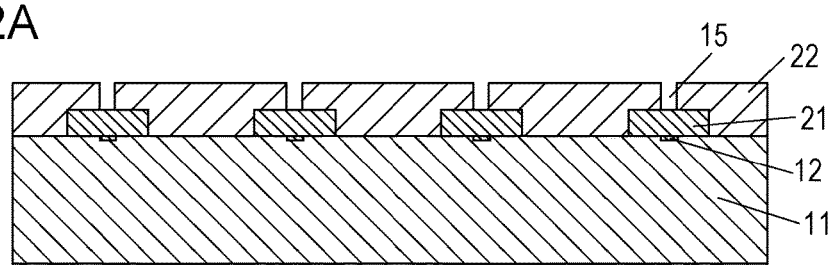
FIGS. 2A to 2H are schematic sectional views illustrating an example of a method for producing the liquid ejection head of the invention.
Figure 2B:
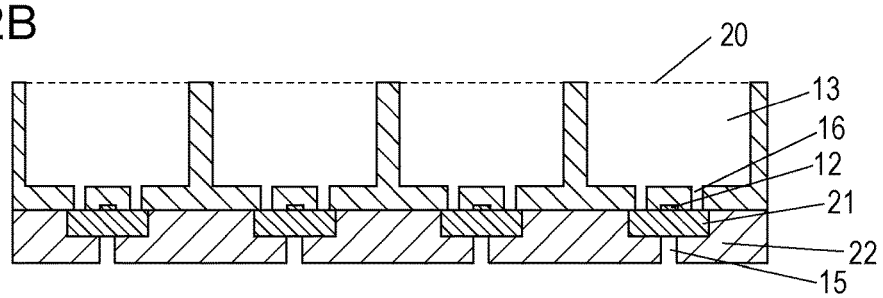

First, on a substrate 11 including energy generating elements 12, a pattern serving as a flow passage mold 21 is provided by using a positive photosensitive resin, and then, an ejection orifice forming member 22 and an airspace pattern serving as ejection orifices 15 are formed by using a negative photosensitive resin (FIG. 2A). Subsequently, by using a photolithography technique and a Si deep etching technique, common liquid chambers 13 and ink supply ports 16 that are used for supplying ink are formed from a rear surface side of the substrate 11 (FIG. 2B). In this manner, the substrate 11 on which a plurality of concave shapes (common liquid chambers 13) are processed is obtained. Note that, figures FIG. 2B and subsequent thereto are illustrated with the upper side and the lower side reversed to FIG. 2A.

Figure 2C:
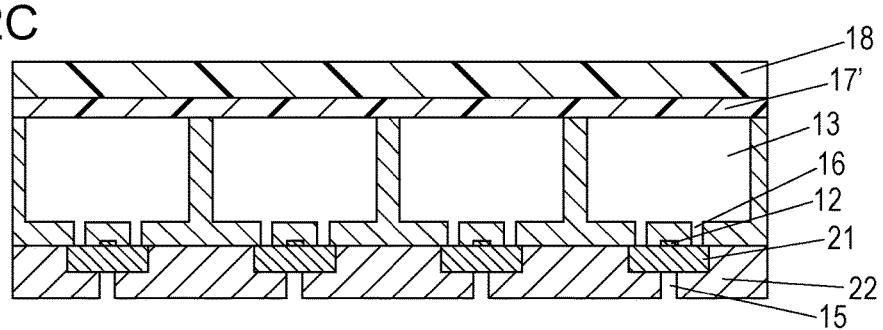
Figure 2D:
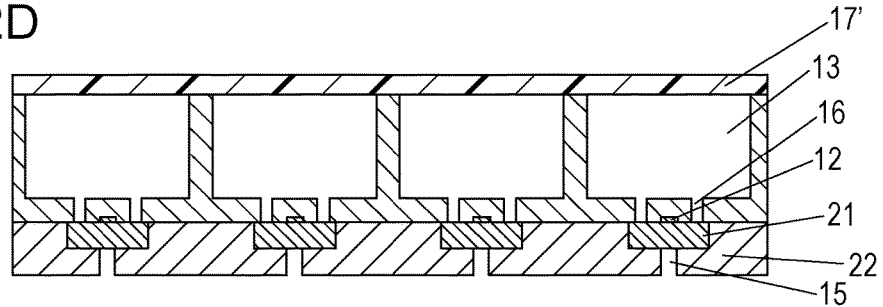
Figure 2E:
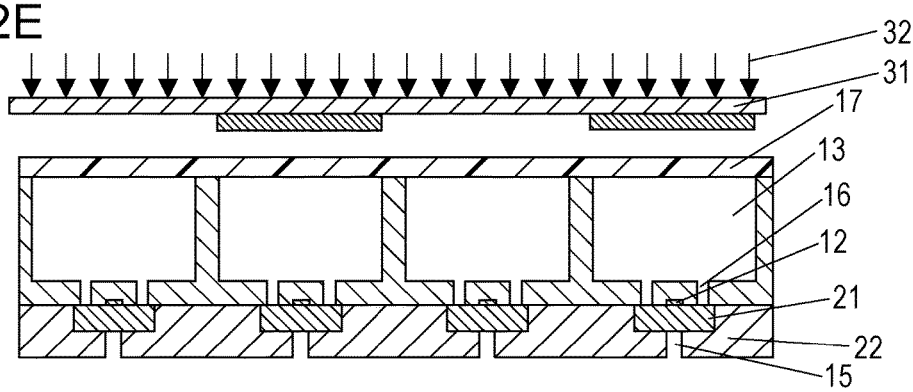
Figure 2F:
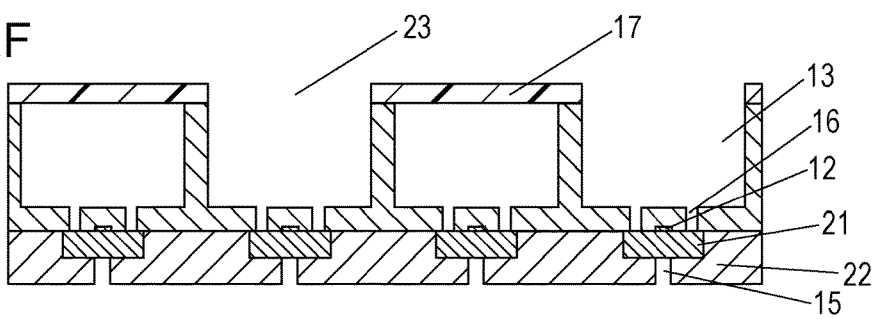

Next, a flow passage member 17 provided with flow passage manifolds (openings 23) for suppling ink to the common liquid chambers 13 is formed on surfaces 20 (hereinafter, referred to as "open faces") facing the surfaces of the common liquid chambers 13, on which the ink supply ports 16 are formed. First, a negative dry film resist 17' coated on a base film 18 is stuck to the rear surface of the substrate 11 by using a laminator, and the resultant is subjected to tenting on the open faces 20 of the common liquid chambers 13 (FIG. 2C). Note that, a portion of the dry film resist 17' on the open faces 20 is referred to as a tenting part. As the dry film resist 17', for example, a chemically amplified negative photosensitive resin containing photoacid generating agent or the like is used. As the base film 18, for example, a PET film, a polyimide film, a hydrocarbon (polyolefin) film, or the like is used. Next, the base film 18 is peeled off (FIG. 2D), and first exposure light 32 is radiated through a mask 31 to regions other than the tenting part where openings are formed (FIG. 2E, first exposure step). Further, by performing post baking and developing an unexposed part at the first exposure step with developer, the flow passage member 17 having the openings 23 (flow passage manifolds) is formed (FIG. 2F).

Figure 2G:
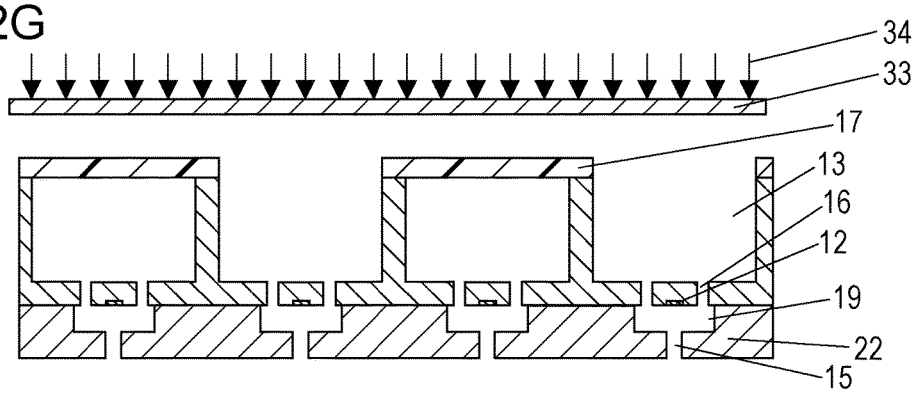
Figure 2H:
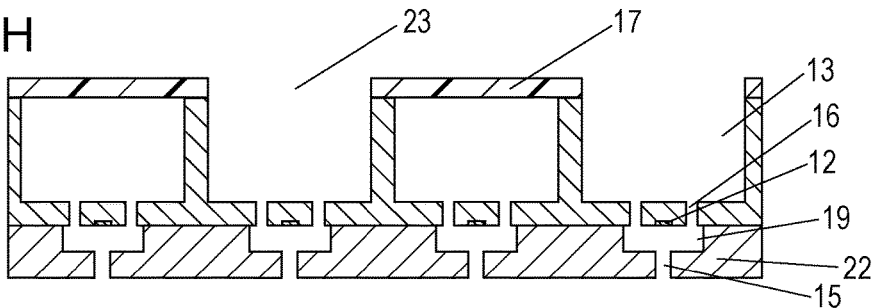

Next, after removing the flow passage mold 21, second exposure light 34 is radiated through a blank mask 33 so as to be overexposed (FIG. 2G, second exposure step). After that, by performing curing processing, the liquid ejection head having the shape illustrated in FIGS. 1A and 1B is able to be produced (FIG. 2H).

As described above, the method for producing the liquid ejection head according to the invention includes the first exposure step and the second exposure step. By performing the first exposure step under exposure conditions optimum for patterning and performing the second exposure step to cause overexposure in order to improve adhesiveness and ink resistance, it is possible to produce the liquid ejection head excellent in adhesiveness between the substrate and the flow passage member and in ink resistance while suppressing an effect of diffused reflection by bottom surfaces of the common liquid chambers.

An exposure machine used at the exposure steps is not particularly limited and a publicly known exposure machine can be used. As the exposure light, publicly known exposure light such as a carbon arc lamp, a mercury vapor arc lamp, a high pressure mercury lamp (g-line (436 nm), h-line (405 nm), i-line (365 nm)), a xenon lamp, YAG laser, Ar ion laser, semiconductor laser, F2 excimer laser (157 nm), ArF excimer laser (193 nm), or KrF excimer laser (248 nm) may be used. The exposure light may be selected as appropriate according to a photosensitive wavelength of the dry film resist 17' to be exposed.

In an exemplary embodiment of the invention, adjustment is performed so that an exposure dose ($E1$) of the first exposure light 32 at the first exposure step is 6 times or less of an exposure dose ($E_{gel}$) for gelling of the negative photosensitive resin used as the dry film resist 17'. When $E1$ is 6 times or less of $E_{gel}$, it is possible to suppress the exposure light being transmitted through the photosensitive resin and causing deterioration in the opening shapes due to the effect of diffused reflection by the bottom surfaces of the common liquid chambers. Moreover, it is preferable that $E1$ is greater than an exposure dose ($E_{th}$) of resolution limit with which development is allowed, and, for example, is 1.2 times or more of the exposure dose ($E_{th}$) of resolution limit, and more preferably 1.5 times or more of the exposure dose ($E_{th}$) of resolution limit.

Figure 3:
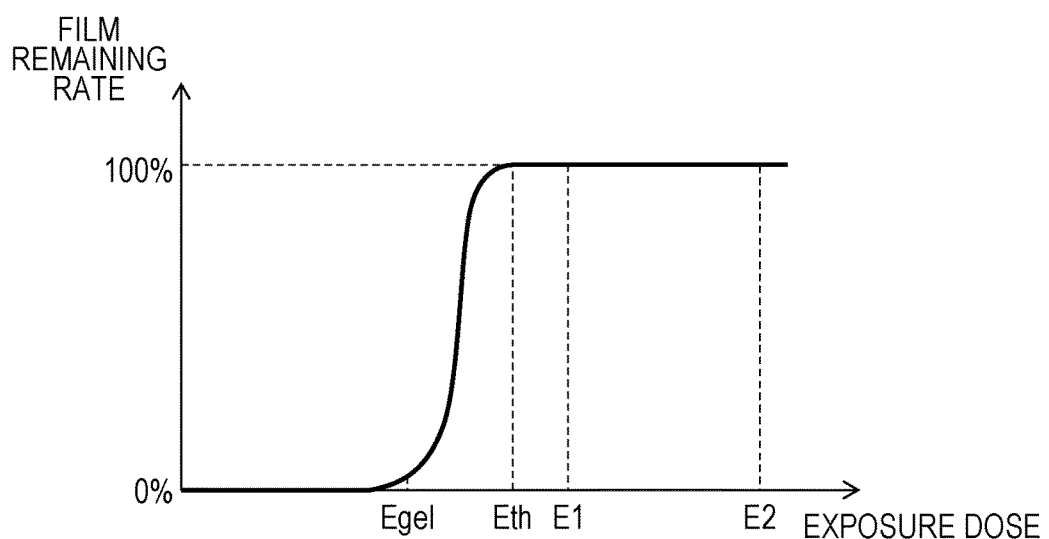
FIG. 3 illustrates a sensitivity curve indicating an example of a relation among an exposure dose (E1) of first exposure light, an exposure dose (E2) of second exposure light, an exposure dose ($E_{gel}$) for gelling of a dry film resist, and an exposure dose ($E_{th}$) of resolution limit according to the invention.

On the other hand, an exposure dose (E2) of the second exposure light 34 can be excessive (overexposure) for enhancing adhesiveness with the substrate 11 and ink resistance. Curing processing is performed after the exposure steps to promote curing so that catalyst components, such as acid, generated by exposure are not deactivated. It is preferable that E2 is, for example, 10 times or more of the exposure dose ($E_{th}$) of resolution limit. Even when the second exposure light is overexposed, the dry film resist 17' has been already developed through the first exposure step, so that deterioration of the shapes due to the overexposure does not occur and the flow passage member having excellent openings is able to be formed. Note that, FIG. 3 illustrates an example of a relation among E1, E2, $E_{gel}$, and $E_{th}$.

An exposure wavelength in the first exposure step affects the opening shapes to be formed in the flow passage member. From a viewpoint of sectional shapes of the openings to be vertical, the g-line, the h-line, the i-line, the excimer laser, and the like including the photosensitive wavelength of the dry film resist 17' can be used. In the second exposure step as well, the same exposure machine as that used at the first exposure step can be used and exposure can be performed so as to cause overexposure by using the g-line, the h-line, the i-line, the excimer laser, and the like including the photosensitive wavelength of the dry film resist 17' in a similar manner to the above.

At the second exposure step, exposure may be performed to cause overexposure by using the second exposure light having a broadband wavelength including the wavelength of the first exposure light. Such exposure, though using an illumination system different from that of the first exposure step, allows radiation of exposure light from a short wavelength side acting on a film surface to a long wavelength side acting on inside the film and is thus advantageous from a viewpoint of uniformalization of distribution of polymerization in a film thickness direction. For example, exposure light including a wavelength region in which absorbance of the dry film resist 17' is 0 to 0.2 can be used as the first exposure light and exposure light including a wavelength region in which absorbance of the dry film resist 17' is 0 to 1 can be used as the second exposure light. Note that, the absorbance is a relative value when the maximum absorbance is 1.

It is also possible to perform exposure so as to cause overexposure by using exposure light having a broadband wavelength not including the wavelength of the first exposure light at the second exposure step. Such exposure, though using an illumination system different from that of the first exposure step, allows radiation of exposure light from a short wavelength side acting on a film surface to a long wavelength side acting on inside the film and is thus advantageous from a viewpoint of uniformalization of distribution of polymerization in a film thickness direction. When the second exposure light is excessively radiated to the ejection orifice forming member 22, degradation of the ejection orifice forming member 22 may be caused. Thus, the exposure can be performed at the first exposure step by selecting a wavelength region having a high transmittance in order to cause sectional shapes to be vertical. That is, for example, exposure light including a wavelength region in which absorbance of the dry film resist 17' is 0 to 0.2 can be used as the first exposure light and exposure light including a wavelength region in a range excluding the wavelength region of the first exposure light, for example, a wavelength region in which absorbance of the dry film resist 17' is 0.2 to 1 can be used as the second exposure light.

Figure 4:
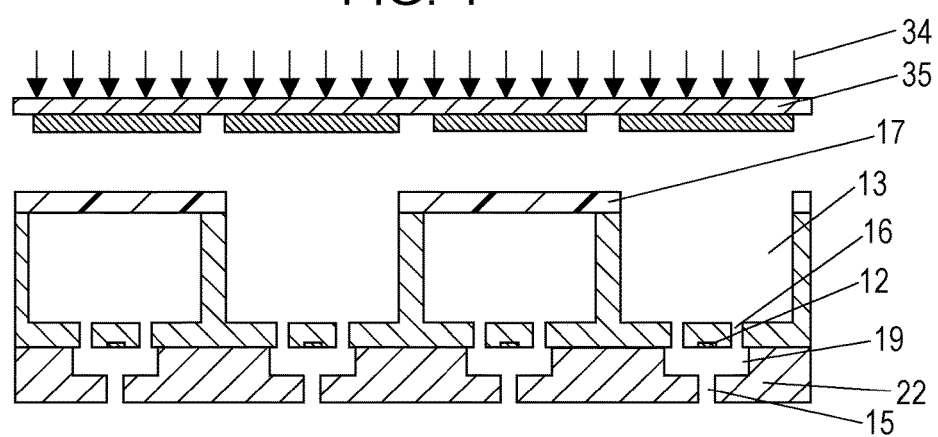
FIG. 4 is a schematic sectional view illustrating a second exposure step in an embodiment of the invention.

In order to suppress degradation of the ejection orifice forming member 22 caused when the second exposure light is excessively radiated, it is also possible to radiate the second exposure light 34 through a mask 35, having a pattern formed thereon, as illustrated in FIG. 4 so that the tenting part is not exposed.

[Exemplary Embodiment]
[Exemplary Embodiment 1]

The liquid ejection head was created in accordance with the following steps.

First, the substrate 11 provided with the energy generating elements 12 and semiconductor elements for driving and controlling the energy generating elements 12 was subjected to application of ODUR-1010 (manufactured by Tokyo Ohka Kogyo Co., Ltd.) as a positive photosensitive resin by a spin coating method at a thickness of 14 μm and then dried. Next, after deep-UV light was radiated in a pattern, development was performed by a processing device (CDS-8000) with use of methyl isobutyl ketone and rinsing was performed with isopropyl alcohol, to thereby form a pattern serving as the flow passage mold 21.

Subsequently, the substrate 11 was subjected to application of a negative photosensitive resin (100 parts of EHPE-3150 (manufactured by Daicel Corporation), 5 parts of A-187 (manufactured by NUC Corporation), 2 parts of SP-170 (manufactured by ADEKA CORPORATION), and 80 parts of xylene) by a spin coating method at a thickness of 10 μm and then dried. After a stepper was used to perform ultraviolet ray exposure and post baking was performed, development with a mixed liquid of methyl isobutyl ketone/xylene=⅔ was performed, so that the ejection orifice forming member 22 and the airspace pattern serving as the ejection orifices 15 were formed (FIG. 2A).

After that, in order to protect the ejection orifice forming member 22, a surface side and a periphery of the substrate 11 were coated with a rubber resin. Next, the common liquid chambers 13 having 400 μm in depth and 200 μm in width and the ink supply ports 16 were formed by using a photolithography technique and a Si deep etching technique (FIG. 2B).

Next, the base film 18 was laminated by a laminator by using TMMF (registered trademark, manufactured by Tokyo Ohka Kogyo Co, LTD.) as the negative dry film resist 17' at a stage temperature and a roller temperature of 40° C., a roller pressure of 0.2 MPa, and a roller speed of 10 mm/s (FIG. 2C). Subsequently, after the base film 18 was peeled off (FIG. 2D), the first exposure light 32 with an exposure dose of 400 mJ/cm² was radiated in a pattern through the mask 31 by using an i-line exposure machine capable of rear surface alignment (FIG. 2E). After that, post baking was performed and an unexposed part was developed with propylene glycol 1-monomethyl ether 2-acetate to form the flowing passage member 17 (FIG. 2F).

Next, deep-UV light was radiated and the flow passage mold 21 was removed by using methyl lactate to form flow passages 19, and then, the i-line exposure machine was used again to radiate the second exposure light 34 with an exposure dose of 2000 mJ/cm² to a full surface through the blank mask 33 (FIG. 2G). Further, by performing curing processing at 200° C. for one hour, the liquid ejection head was created (FIG. 2H). As for the created liquid ejection head, the opening shape of the flow passage member and ink resistance were evaluated. Results thereof are indicated in Table 1.

Note that, the evaluation of the ink resistance also means evaluation of adhesiveness. In such evaluation, a PCT test was performed under conditions that the liquid ejection head was immersed for ten hours in alkaline ink under an atmosphere of 121° C. and a pressure of 2 atmospheres, and then, floating of a pattern from the substrate and presence of detachment were checked with use of an electron microscope in observation of a L/S (line-and-space) pattern. In addition, in Table 1, the opening shape and the ink resistance were evaluated based on the following standards.

[Opening Shape]
  Good: Opening shape was good.
  Poor: Opening shape was not good.
[Ink Resistance]
  Good: No detachment or floating was observed.
  Fair: Floating was observed, but no detachment was observed.
  Poor: Floating and detachment were observed.
[Exemplary Embodiment 2]

The liquid ejection head was produced similarly to the exemplary embodiment 1 except that the exposure dose of the second exposure light was 8000 mJ/cm². The opening shape and the ink resistance of the produced liquid ejection head were evaluated. Results thereof are indicated in Table 1.

[Exemplary Embodiment 3]

The liquid ejection head was produced similarly to the exemplary embodiment 1 except that the exposure dose of the second exposure light was 1000 mJ/cm². The opening shape and the ink resistance of the produced liquid ejection head were evaluated. Results thereof are indicated in Table 1.

[Comparative Example]1

Similarly to the exemplary embodiment 1, the pattern serving as the flow passage mold 21, the ejection orifice forming member 22, the airspace pattern serving as the ejection orifices 15, the common liquid chambers 13, and the ink supply ports 16 were sequentially formed on the substrate 11 provided with the energy generating elements 12 and the semiconductor elements (FIG. 2A and FIG. 2B). Next, the base film 18 was laminated by a laminator using TMMF (registered trademark, manufactured by Tokyo Ohka Kogyo Co, LTD.) as the negative dry film resist 17' at a stage temperature and a roller temperature of 40° C., a roller pressure of 0.2 MPa, and a roller speed of 10 mm/s (FIG. 2C). Subsequently, after the base film 18 was peeled off (FIG. 2D), the first exposure light 32 with an exposure dose of 400 mJ/cm² was radiated in a pattern through the mask 31 by using an i-line exposure machine capable of rear surface alignment (FIG. 2E). After that, post baking was performed and development was performed with propylene glycol 1-monomethyl ether 2-acetate to form the flowing passage member 17 (FIG. 2F). Next, deep-UV light was radiated and the ink flow passage mold 21 was removed by using methyl lactate to form the flow passages 19, and then, by performing curing processing at 200° C. for one hour, the liquid ejection head was produced. The opening shape and the ink resistance of the created liquid ejection head were evaluated. Results thereof are indicated in Table 1.

[Comparative Example]2

The liquid ejection head was produced similarly to the comparative example 1 except that the exposure dose of the first exposure light was 700 mJ/cm². The opening shape and the ink resistance of the produced liquid ejection head were evaluated. Results thereof are indicated in Table 1.

[Comparative Example]3

The liquid ejection head was produced similarly to the exemplary embodiment 1 except that the exposure dose of the first exposure light was 700 mJ/cm² and the exposure dose of the second exposure light was 1000 mJ/cm². The opening shape and the ink resistance of the produced liquid ejection head were evaluated. Results thereof are indicated in Table 1.

TABLE 1

| | Exposure dose for gelling ($E_{gel}$, mJ/cm²) | Exposure dose of resolution limit ($E_{th}$, mJ/cm²) | First exposure dose (E1, mJ/cm²) | Second exposure dose (E2, mJ/cm²) | Opening shape | Ink resistance |
|---|---|---|---|---|---|---|
| Exemplary embodiment 1 | 70 | 150 | 400 | 2000 | Good | Good |
| Exemplary embodiment 2 | 70 | 150 | 400 | 8000 | Good | Good |
| Exemplary embodiment 3 | 70 | 150 | 400 | 1000 | Good | Fair |
| Comparative example 1 | 70 | 150 | 400 | — | Good | Poor |
| Comparative example 2 | 70 | 150 | 700 | — | Poor | Fair |
| Comparative example 3 | 70 | 150 | 700 | 1000 | Poor | Good |

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-154286 filed Aug. 4, 2015, which is hereby incorporated by reference herein in its entirety.

What is claimed is:

1. A method for producing a microstructure provided with a member in which, on a substrate having a plurality of concave shapes processed thereon, a negative dry film resist is subjected to tenting on open faces of the plurality of concave shapes and then openings are formed in a tenting part of the dry film resist, the method comprising:
  forming the openings through steps including
    a first exposure step of performing exposure with a first exposure light for the dry film resist other than a region in which the openings are formed,
    a post baking step, and
    a step of developing an unexposed part at the first exposure step with developer; and
  forming the member by performing steps including
    a second exposure step of performing exposure so as to cause overexposure with second exposure light radiated through a solid blank mask and a step of performing curing processing in this order, wherein an exposure dose (E1) of the first exposure light of the first exposure step is six times or less of an exposure dose ($E_{gel}$) of the second exposure light used for gelling of the dry film resist.

2. The method for producing a microstructure according to claim 1, wherein the exposure dose (E1) of the first exposure light is greater than an exposure dose ($E_{th}$) of resolution limit of the dry film resist, and an exposure dose (E2) of the second exposure light is ten times or more of the exposure dose ($E_{th}$) of resolution limit of the dry film resist.

3. The method for producing a microstructure according to claim 2, wherein both of the first exposure light and the second exposure light include a photosensitive wavelength of the dry film resist.

4. The method for producing a microstructure according to claim 2, wherein the first exposure light includes a photosensitive wavelength of the dry film resist and the second exposure light is exposure light having a broadband wavelength including the wavelength of the first exposure light.

5. The method for producing a microstructure according to claim 4, wherein the first exposure light is exposure light including a wavelength region in which absorbance of the dry film resist is 0 to 0.2 and the second exposure light is exposure light including a wavelength region in which absorbance of the dry film resist is 0 to 1.

6. The method for producing a microstructure according to claim 2, wherein the first exposure light includes a photosensitive wavelength of the dry film resist and the second exposure light is exposure light having a broadband wavelength not including the wavelength of the first exposure light.

7. The method for producing a microstructure according to claim 6, wherein the first exposure light is exposure light including a wavelength region in which absorbance of the dry film resist is 0 to 0.2 and the second exposure light is exposure light including a wavelength region in which absorbance of the dry film resist is 0.2 to 1.

8. The method for producing a microstructure according to claim 2, wherein the first exposure light includes a photosensitive wavelength of the dry film resist and the second exposure step is performed by performing radiation in a pattern through a mask so that the tenting part of the dry film resist is not exposed.

9. The method for producing a microstructure according to claim 1, wherein both of the first exposure light and the second exposure light include a photosensitive wavelength of the dry film resist.

10. The method for producing a microstructure according to claim 1, wherein the first exposure light incudes a photosensitive wavelength of the dry film resist and the second exposure light is exposure light having a broadband wavelength including the wavelength of the first exposure light.

11. The method for producing a microstructure according to claim 10, wherein the first exposure light is exposure light including a wavelength region in which absorbance of the dry film resist is 0 to 0.2 and the second exposure light is exposure light including a wavelength region in which absorbance of the dry film resist is 0 to 1.

12. The method for producing a microstructure according to claim 1, wherein the first exposure light includes a photosensitive wavelength of the dry film resist and the second exposure light is exposure light having a broadband wavelength not including the wavelength of the first exposure light.

13. The method for producing a microstructure according to claim 12, wherein the first exposure light is exposure light including a wavelength region in which absorbance of the dry film resist is 0 to 0.2 and the second exposure light is exposure light including a wavelength region in which absorbance of the dry film resist is 0.2 to 1.

14. The method for producing a microstructure according to claim 1, wherein the first exposure light includes a photosensitive wavelength of the dry film resist and the second exposure step is performed by performing radiation in a pattern through a mask so that the tenting part of the dry film resist is not exposed.

* * * * *